United States Patent [19]

Kanatani

[11] 4,402,596

[45] Sep. 6, 1983

[54] PROJECTION TYPE EXPOSURE DEVICE

[75] Inventor: Fujio Kanatani, Yokosuka, Japan

[73] Assignee: Nippon Kogaku K.K., Tokyo, Japan

[21] Appl. No.: 345,645

[22] Filed: Feb. 4, 1982

[30] Foreign Application Priority Data

Feb. 27, 1981 [JP] Japan .................. 56-28034

[51] Int. Cl.³ .................. G03B 27/52; G03B 27/70
[52] U.S. Cl. .................. 355/43; 355/45; 355/53; 355/62; 356/401
[58] Field of Search .......... 355/45, 53, 43, 60–63, 355/77; 356/401

[56] References Cited

U.S. PATENT DOCUMENTS

| | | | |
|---|---|---|---|
| 3,853,398 | 12/1974 | Kano | 355/45 X |
| 3,984,186 | 10/1976 | Momose et al. | 355/45 |
| 4,269,505 | 5/1981 | Mayer | 355/62 |
| 4,295,735 | 10/1981 | Lacombat et al. | 355/63 X |
| 4,362,385 | 12/1982 | Lobach | 355/53 X |
| 4,367,046 | 1/1983 | Lacombat | 355/53 X |

Primary Examiner—Richard A. Wintercorn
Attorney, Agent, or Firm—Shapiro and Shapiro

[57] ABSTRACT

A projection type exposure device includes a main projection objective lens for projecting onto a wafer a predetermined pattern on a negative plate to be projected, a main illuminating optical system including a condenser lens for illuminating the negative plate to be projected, and an alignment optical system for forming the image of a reference mark provided on the negative plate to be projected and the image of an alignment mark on the wafer through the main projection objective lens from between the condenser lens and the main projection objective lens. The alignment optical system has a first objective lens and a second objective lens for condensing the light beam from the first objective lens, the first and second objective lenses being disposed on the same optical axis, and a reflecting member for bending the optical axis so that it is orthogonal to the negative plate to be projected. The first objective lens and the reflecting member are movable together relative to the negative plate to be projected.

6 Claims, 3 Drawing Figures

PROJECTION TYPE EXPOSURE DEVICE

BACKGROUND OF THE INVENTION

1. Field of the Invention

This invention relates to an alignment optical system in a projection type exposure device, particularly, a reduction projection type exposure device used for the manufacture of integrated circuits (LSI, VLSI, etc.).

2. Description of the Prior Art

In a reduction projection type exposure device, the area for one exposure is small and therefore the so-called step exposure is carried out in which a wafer is moved for each exposure to repeat the same exposure.

Generally, there are the following two types of step exposure.

(a) The type in which a reticle and a wafer are positioned entirely separately, whereafter the wafer is fed by a predetermined step amount to thereby effect exposure (the off-axis type).

(b) The type in which step exposure is effected while maintaining the relative positional relation between the pattern on a reticle and the pattern on a wafer through a projection lens (the through-the-lens type).

These two types have their own merits and demerits, and when the processed amount (through put) is chiefly considered, the type (a) is more advantageous and when the accuracy is chiefly considered, the type (b) is more advantageous.

To enhance the accuracy of position adjustment, it is necessary that the light for alignment be of the same wavelength as the exposure light. The size of the area of the pattern printed on a wafer (generally called the chip size) is not always constant. It is also necessary to reassume the relative positional relation between the pattern on the reticle and the pattern on the wafer during each exposure. This is called the step alignment. The alignment mark on the wafer used in the step alignment is usually placed on a scribe line lying immediately outside the effective area. If, during the step alignment, the other effective area than this scribe line is illuminated, it will impart other exposure than the regular exposure to the effective area and will thus cause irregularity of exposure, flare and ghost. Moreover, such an optical system for step alignment is inserted between the reticle and the condenser lens for exposure illumination and therefore, it must be disposed such that no vignetting occurs to the exposure, and this has meant great limitations.

SUMMARY OF THE INVENTION

It is an object of the present invention to provide an alignment optical system which, in spite of the above-noted limitations or problems peculiar to the step alignment optical system, enables the alignment mark on the wafer and the reference mark on the negative plate such as reticle to be projected to be accurately observed without adversely affecting the exposed area of the wafer.

The construction of the present invention consists in an alignment optical system through which, for the position adjustment of the negative plate to be projected and the wafer in a projection type exposure device, the image of the reference mark on the negative plate to be projected and the image of the alignment mark on the wafer formed on the negative plate to be projected by a main projection objective lens may be observed and which has a first objective lens for projecting the images of said reference mark and said alignment mark, a reflecting member obliquely disposed for making the focal plane of said first objective lens coincide with said negative plate to be projected, a second objective lens for condensing the light beam from said first objective lens, a diaphragm member disposed at the focus position of said second objective lens, a condenser lens disposed with its focus coincident with the position of said diaphragm member, a light source for supplying an illuminating light through said condenser lens, and an optical path separating member obliquely disposed near said diaphragm member and wherein said first and second objective lenses and said condenser lens are disposed on the same optical axis and said first objective lens and said reflecting member are movable together along said negative plate to be projected in a plane containing said optical axis so that the focus of said first objective lens moves on said negative plate to be projected.

The invention will become more fully apparent from the following detailed description thereof taken in conjunction with the accompanying drawings.

DESCRIPTION OF THE PREFERRED EMBODIMENTS

Figures 1, 2:
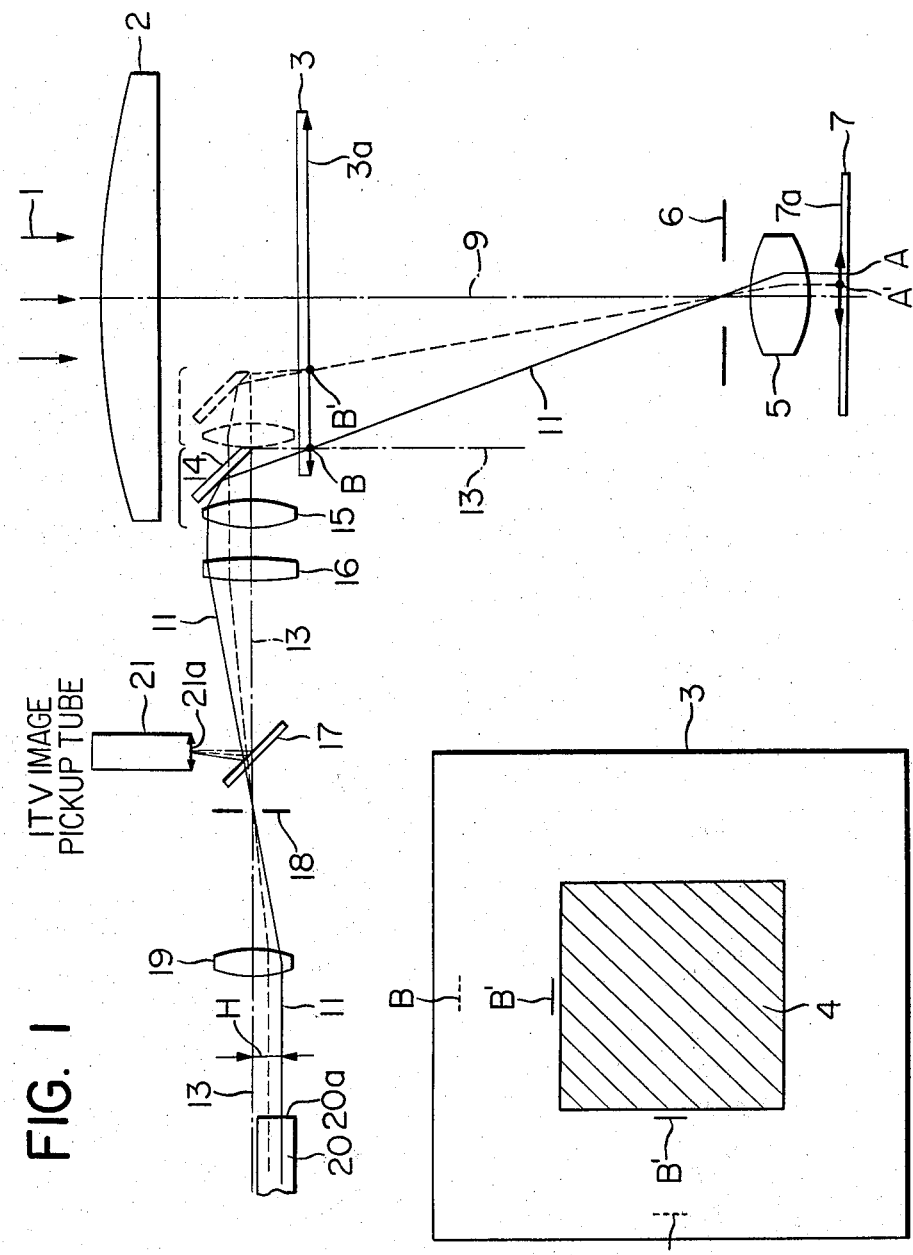
FIG. 1 is an optical arrangement illustration of an embodiment schematically showing the exposure optical system and the alignment optical system of a reduction projection type exposure device.
FIG. 2 is a plan view of a reticle.

FIG. 1 is an optical arrangement illustration schematically illustrating the exposure optical system and the alignment optical system of a reduction projection type exposure device. An exposure light beam 1 is supplied from a light source unit, not shown, and illuminates a reticle 3 as a negative plate to be projected by a main condenser 2. The image of the light source is formed in the entrance pupil plane 6 of a main projection lens 5 by the main condenser 2. A predetermined pattern is formed on the pattern surface 3a of the reticle 3 and this pattern is reduction-projected onto the pattern surface 7a of a wafer 7 at a predetermined magnification by the main projection lens 5. The exposure light beam 1 is a light effective to sensitize the photoresist applied onto the pattern surface 7a of the wafer 7, and this light may be, for example, a wavelength 435.8 nm (g-line) or a wavelength 404.7 nm (h-line) generated from a super-high pressure mercury lamp.

In contrast to such an exposure optical system, an alignment optical system for observing therethrough the positional relation between an alignment mark A provided on the scribe line on the wafer 7 and a reference mark B provided on the marginal portion of the pattern surface 3a of the reticle 3 is as follows and use is made of the same light as the exposure light. Provided on the upper portion of the peripheral edge of the reticle 3 are a reflecting mirror 14, a first objective lens 15 and a second objective lens 16. The optical axis 13 of the first objective lens 15 is caused to be orthogonal to the pattern surface 3a of the reticle 3 by the reflecting mirror 14 and accordingly, is substantially parallel to the optical axis 9 of the main projection lens 5, and the forward focus of the first objective lens 15 is positioned on the pattern surface 3a of the reticle 3. While maintaining such positional relation, the first objective lens 15 and the reflecting mirror 14 are movable together parallel to the reticle 3 along the optical axis 13. Accordingly, the space between the first objective lens 15 and the second objective lens 16 is always a parallel beam system, and a diaphragm 18 provided at the rearward focus position of the second objective lens 16 and the pattern surface 3a of the reticle 3 are conjugate with respect to the first and second objective lenses and are also conjugate with the pattern surface 7a of the wafer 7 with respect to the main projection objective lens 5. A condenser lens 19 is provided rearwardly of the diaphragm 18 and the focus thereof is coincident with the position of the diaphragm 18. The condenser lens 19 is disposed coaxially with the optical axis 13 of the first and second objective lenses. The exit surface 20a of a light guide 20 such as optical fiber bundle for supplying the illuminating light has its center provided off the optical axis 13. On the other hand, an ITV image pickup tube 21 is provided through a beam splitter 17 provided near the diaphragm 18, and the image pickup surface 21a of the image pickup tube 21, like the diaphragm 18, is conjugate with the pattern surface 3a with respect to the first and second objective lenses 15 and 16, and is also conjugate with the pattern surface 7a of the wafer 7.

By such a construction, the light beam from the light guide 20 is supplied to both the alignment mark A provided on the pattern surface 7a of the wafer 7 and the reference mark B provided on the pattern surface 3a of the reticle 3, and the images of the two marks may be observed through the ITV image pickup tube 21. In FIG. 1, the state of a principal ray 11 passing through the alignment mark A and the reference mark B is depicted by solid line. The principal ray 11 becomes parallel to the optical axis after having left the first objective lens 15, and is reflected by a beam splitter 17, whereafter it reaches the center of the image pickup surface 21a of the image pickup tube 21. On the other hand, the principal ray 11 passing through the beam splitter 17 passes through the center of the diaphragm 18, is refracted by the condenser lens 19 and becomes parallel to the optical axis 13 and reaches substantially the center of the light guide 20. That is, this principal ray 11 corresponds to the principal ray of the illuminating light supplied from the light guide 20.

Since the space between the first objective lens 15 and the second objective lens 16 is constructed into a parallel beam system, the conjugate relations between the reticle pattern surface 3a and the diaphragm 18 and the ITV image pickup surface 21a remain unchanged even if the spacing between the first and second objective lenses is varied. Accordingly, even if the position of the alignment mark is changed with the change in the chip size, a focused image can be constantly viewed on a monitor TV by moving the first objective lens 15 and the reflecting mirror 14 as a unit to a new alignment mark position and moreover, the diaphragm 18 functions as a field aperture, whereby the illuminating area is limited, so that there is no possibility that any other area than the scribe line is illuminated.

Now consider a case where the position of the alignment mark is at a predetermined location. The size and position of the end surface 20a of the light guide 20 may be adjusted to the size and position of the image of the pupil 6 of the main projection objective lens by the first and second objective lenses 15 and 16 and the condenser lens 19.

In the present invention, the pupil 6 of the main progection objective lens lies at a position off the optical axis 13 of the first and second objective lenses and therefore, it is desirable that the end surface 20a of the light guide as the light source be positioned off the optical axis. In such case, there is formed a Köhler's illumination with the pupil 6 of the main projection objective lens as the aperture stop and moreover, the illumination is an incoherent illumination and thus, an image of uniform brightness exhibiting a high resolution may be observed on the monitor TV.

In practice, however, the position of the alignment mark also changes in accordance with the change in chip size. The alignment reference mark provided on the reticle must have its image formed on the scribe line of the wafer and therefore, it is provided closely adjacent to the circumference of the pattern of the reticle. Therefore, where the pattern portion 4 is small as shown in the reticle plan view of FIG. 2, the reference mark B' for this pattern is positioned inside the reference mark B for a case where the pattern portion is large. In this case, the first objective lens 15 and the reflecting mirror 14 are moved together to their positions indicated by dotted lines in FIG. 1, whereby the reference mark B' becomes observable. The state of the principal ray in this condition is also depicted by dotted line in FIG. 1. As is shown, the height of the principal ray in the first and second objective lenses 15 and 16 varies, but no change occurs to the fact that the image pickup surface 21a of the image pickup tube 21 is conjugate with the pattern surface 3a of the reticle 3.

However, the height of the principal ray in the light guide 20 somewhat varies. Further, due to the air space between the first objective lens 15 and the second objective lens 16 varying, the position of the image of the entrance pupil 6 of the main projection objective lens 5 by the first and second objective lenses and the condenser lens varies somewhat in the direction of the optical axis 13 as well. Accordingly, in order to form a strict Köhler's illuminating system, it is desirable that the position of the end surface 20a of the light guide 20 be moved both in the direction of the optical axis 13 and in the direction perpendicular thereto in accordance with the position of the alignment mark. It is desirable to change the thickness of the light guide simultaneously with the movement of the position thereof, but since an aperture stop is provided separately in this light guide, it is not necessary to change the thickness of the light guide if a little thicker light guide is used.

In the illustrated embodiment, the reflecting mirror 14 is provided obliquely at 45° with respect to the pattern surface 3a of the reticle 3 and therefore, the optical axis of the first objective lens 15 is disposed parallel to the reticle 3 by reflection while being orthogonal to the pattern surface 3a of the reticle and this construction is simplest. However, this is not restrictive, but if the optical axis of the first objective lens 15 is only orthogonal in the pattern surface 3a of the reticle 3, the reflecting mirror 14 may be inclined at any other angle than 45° and the optical axis 13 of the first objective lens after reflection may be non-parallel to the reticle 3. In this case, it is necessary that the first objective lens 15 and the reflecting mirror 14 be moved together along the reticle 3 in a plane containing the optical axis.

Figure 3:
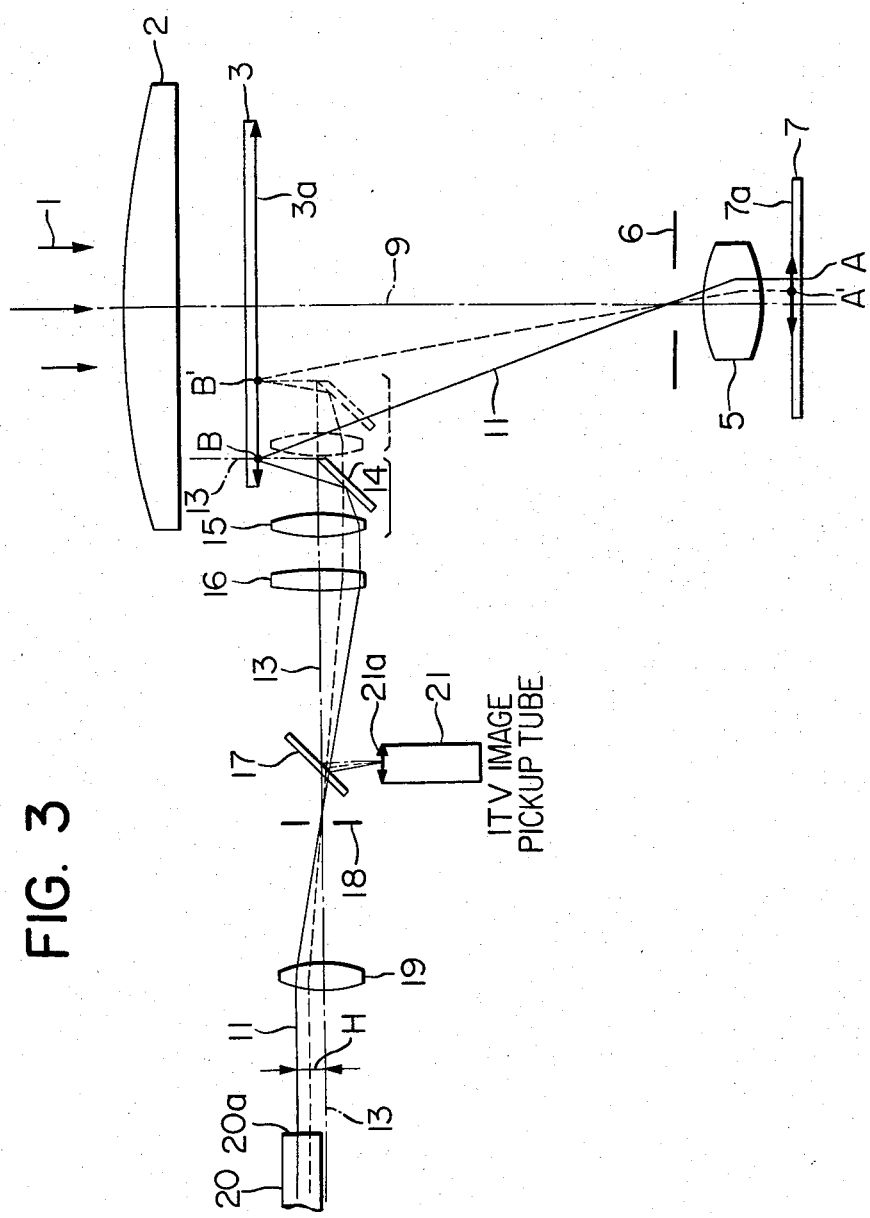
FIG. 3 is an optical arrangement illustration of a second embodiment.

In the above-described embodiment, a construction has been adopted in which an alignment optical system is disposed between the reticle 3 and the condenser lens 2 and the alignment mark A on the wafer 7 and the reference mark B on the reticle 3 are observed with the aid of the light passed through the reticle 3, but such construction is not restrictive. In a second embodiment shown in FIG. 3, the alignment optical system is disposed between the reticle 3 and the projection objective lens 5 so that the alignment mark A on the wafer 7 and the reference mark B on the reticle 3 are observed with the aid of the reflected light on the pattern surface 3a of the reticle 3. In FIG. 3, members functionally similar to those in the first embodiment of FIG. 1 are given similar reference numerals. In the second embodiment, the alignment mark A and the reference mark B are observed with the aid of the reflected light on the reticle 3 and therefore, the reference mark B on the reticle 3 is observed with the light and dark thereof reversed, but this forms substantially no inconvenience.

As in the above-described embodiments, even when the chip size has been changed, step alignment can be accomplished with substantially similar accuracy by moving the first objective lens 15 and the reflecting mirror 14 together. Moreover, when it is not necessary to effect alignment, if the first objective lens 15 and the reflecting mirror 14 are moved together toward the second objective lens 16 side, they can be completely retracted from the path of the exposure light beam 1 and thus will not adversely affect the exposure.

Although not shown in FIG. 1, in the present device, another alignment optical system identical to the above-described alignment optical system is provided in a direction perpendicular to the plane of the drawing sheet and, by means of these two alignment optical systems, the alignment marks in two orthogonal directions as shown in FIG. 2 may be observed to effect accurate positioning of the pattern of the reticle and the pattern of the wafer. The observation of the alignment mark and the reference mark is not restricted to being carried out by means of the ITV image pickup tube.

As described above, according to the alignment optical system of the present invention, step alignment can be accomplished without adversely affecting the effective area of the wafer, and not only any change in the chip size can be coped with by a simple construction in which only part of the optical system is moved, but also no hindrance is imparted to the exposure of the wafer by the optical system being retracted from the exposure light path. Moreover, the pattern surface of the reticle and the forward forcal plane of the first objective lens are always substantially coincident with each other and thus, a wide range of the pattern surface can be clearly observed.

I claim:

1. A projection type exposure device including:
   a main projection objective lens for projecting onto a wafer a predetermined pattern on a negative plate to be projected;
   a main illuminating optical system including a condenser lens for illuminating said negative plate to be projected; and
   an alignment optical system for forming the image of a reference mark provided on said negative plate to be projected and the image of an alignment mark on said wafer through said main projection objective lens from between said condenser lens and said main projection objective lens;
   said alignment optical system having a first objective lens and a second objective lens for condensing the light beam from said first objective lens, said first and second objective lenses being disposed on the same optical axis, and a reflecting member for bending said optical axis so that it is orthogonal to said negative plate to be projected, said first objective lens and said reflecting member being movable together relative to said negative to be projected.

2. The device according to claim 1, wherein said first objective lens and said reflecting member of said alignment optical system are provided between said negative plate to be projected and said condenser lens, and the image of the reference mark on said negative plate to be projected and the image of the alignment mark on said wafer are formed by a light passed through said negative plate to be projected.

3. The device according to claim 1, wherein said first objective lens and said reflecting member of said alignment optical system are provided between said negative plate to be projected and said main projection objective lens, and the image of the reference mark on said negative plate to be projected and the image of the alignment mark on said wafer are formed by a light reflected by said negative plate to be projected.

4. The device according to claim 1, wherein said alignment optical system further has a diaphragm member disposed at the focus position of said second objective lens, a condenser lens disposed with its focus being coincident with the position of said diaphragm member, and a light source for supplying an illuminating light through said condenser lens.

5. The device according to claim 4, wherein said alignment optical system further has an optical path separating member obliquely disposed near said diaphragm member, and image pickup means for observing the images of said reference mark and said alignment mark through said optical path separating member.

6. The device according to claim 4, wherein said first objective lens and said reflecting member are movable together along said negative plate to be projected in a plane containing said optical axis so that the focus of said first objective lens moves on said negative plate to be projected.

* * * * *